(12) United States Patent
Zhang

(10) Patent No.: US 11,791,808 B1
(45) Date of Patent: Oct. 17, 2023

(54) FREQUENCY COMB GENERATOR

(71) Applicant: Chengdu Sicore Semiconductor Corp. Ltd., Chengdu (CN)

(72) Inventor: Cemin Zhang, Chino, CA (US)

(73) Assignee: Chengdu Sicore Semiconductor Corp. Ltd., Sichuan (CN)

( * ) Notice: Subject to any disclaimer, the term of this patent is extended or adjusted under 35 U.S.C. 154(b) by 0 days.

(21) Appl. No.: 18/097,335

(22) Filed: Jan. 16, 2023

(30) Foreign Application Priority Data

Dec. 14, 2022  (CN) .......................... 202211607552.X

(51) Int. Cl.
| | | |
|---|---|---|
| *H03K 5/01* | (2006.01) | |
| *H03K 5/13* | (2014.01) | |
| *H03K 4/06* | (2006.01) | |
| *H03H 7/52* | (2006.01) | |

(52) U.S. Cl.
CPC ............... *H03K 4/06* (2013.01); *H03H 7/52* (2013.01); *H03K 5/01* (2013.01); *H03K 5/13* (2013.01)

(58) Field of Classification Search
CPC ............. H03K 5/01; H03K 5/13; H03K 5/145
USPC .......... 307/106, 108; 327/100, 181; 333/218
See application file for complete search history.

(56) References Cited

U.S. PATENT DOCUMENTS

| | | | | |
|---|---|---|---|---|
| 5,422,607 A | * | 6/1995 | McEwan ................ | H03K 5/159 327/100 |
| 5,495,253 A | * | 2/1996 | Albert .............. | H04B 10/25077 342/19 |
| 5,804,921 A | * | 9/1998 | McEwan .................. | H03K 3/57 307/106 |
| 6,346,853 B1 | * | 2/2002 | Kangaslahti ............ | H04B 1/62 330/149 |
| 8,698,570 B2 | * | 4/2014 | Afshari .................... | H03G 3/00 331/177 V |
| 8,878,575 B1 | * | 11/2014 | Blumke ................ | H03B 19/03 327/119 |
| 10,804,804 B1 | * | 10/2020 | Elizondo-Decanini | ...................... H02M 3/07 |

(Continued)

OTHER PUBLICATIONS

Marki Microwave, Inc., "GaAs MMIC Non-Linear Transmission Line NLTL-6794SM", released Dec. 2019, available from the Internet, <URL:https//www.markimicrowave.com/Assets/datasheets/NLTL-6794SM.pdf>, (26 pgs).

*Primary Examiner* — William Hernandez
(74) *Attorney, Agent, or Firm* — North Weber & Baugh LLP; Michael North

(57) ABSTRACT

Various NLTL frequency comb generator embodiments are disclosed for broadband impedance matching to generate an output signal comprising broadband harmonics of an input signal. The NLTL frequency comb generator comprises a plurality of segments cascaded in series, with each segment comprising a series inductor and a non-linear shunt capacitor. The non-linear shunt capacitor may couple to corresponding series inductors in the same polarity. A broadband biasing circuit feeds a DC bias or DC ground to the non-linear shunt capacitors for broadband input and output impedance matching. The broadband biasing circuit may be a low pass filter to prevent RF signal from leaking through the biasing circuit. The NLTL frequency comb generator, the broadband biasing circuit, and an output DC blocking capacitor may be integrated in a single chip in a compact packaging to achieve a broadband input/output impedance matching without relying on external lumped matching components.

19 Claims, 8 Drawing Sheets

(56) References Cited

U.S. PATENT DOCUMENTS

| | | | |
|---|---|---|---|
| 2006/0114550 A1* | 6/2006 | Ricketts | H03B 5/1203 |
| | | | 359/330 |
| 2007/0008048 A1* | 1/2007 | Kintis | H03K 5/156 |
| | | | 333/20 |
| 2007/0030102 A1* | 2/2007 | Afshari | H01P 5/12 |
| | | | 333/263 |
| 2007/0273454 A1* | 11/2007 | Pepper | H03B 19/05 |
| | | | 333/132 |
| 2009/0115545 A1* | 5/2009 | Lan | H04B 1/7174 |
| | | | 332/109 |
| 2022/0385276 A1* | 12/2022 | Doynov | H03H 11/02 |

\* cited by examiner

500

3rd Order (T-type) Broadband Biasing Network

5th Order (Pi-type) Broadband Biasing Network

FREQUENCY COMB GENERATOR

CROSS-REFERENCE TO RELATED APPLICATIONS

This application claims foreign priority to Chinese Patent Application No. 202211607552.X, entitled "FREQUENCY COMB GENERATOR", naming Cemin Zhang as inventor, and filed Dec. 14, 2022, the subject matter of which is hereby incorporated herein by reference.

BACKGROUND

A. Technical Field

The present invention generally relates to frequency comb generators, and more particularly to NLTL frequency comb generators with broadband matching.

B. Background of the Invention

A non-linear transmission line (NLTL) is generally an inductor-capacitor (LC) ladder network that comprises periodically loaded non-linear components, e.g., non-linear inductors or non-linear capacitors. It may be, for example, periodically loaded by reversely biased varactors or Schottky diodes. NLTL has been used in a wide range of device and system applications, including comb generator, time-domain reflectometry (TDR), frequency synthesizer, frequency multiplier, high-speed sampling oscilloscope, pulse generator, etc.

A frequency comb generator is a signal generator that generates an output signal that has appreciable signal power at multiple harmonics of an input signal. This output signal typically comprises a series of uniformly spaced frequency components so that the output signal spectrum has an appearance like that of teeth on a comb.

For broadband input signal with frequency range from tens of MHz to a few GHz, it is challenging for current NLTL based comb generators to achieve broadband input and output impedance matching. Furthermore, external biasing network and external matching network with limited bandwidth are generally required for desired input/output impedance matching and DC feeding. Such limitation restricts broadband applications of NLTL based comb generators.

Accordingly, there is a need for improved NLTL frequency comb generators to address the above issues.

SUMMARY OF THE INVENTION

The present disclosure provides embodiments for frequency comb generators with broadband matching. The application of disclosed embodiments provides improved broadband input and output impedance matching.

Various NLTL frequency comb generator embodiments are disclosed for broadband impedance matching to generate an output signal comprising broadband harmonics of an input signal. The NLTL frequency comb generator comprises a plurality of segments cascaded in series, with each segment comprising a series inductor and a non-linear shunt capacitor with a voltage-dependent capacitance. The non-linear shunt capacitors in the plurality of segments may be varactors, Schottky diodes, or any type of PN junction diodes, and may couple to corresponding series inductors in the same polarity (cathode or anode) or in alternative polarities. A broadband biasing circuit feeds an external DC bias or a DC ground to the non-linear shunt capacitors for broadband input and output impedance matching.

In one or more embodiments, the broadband biasing circuit may be a $3^{rd}$-order or a $5^{th}$-order low pass filter to prevent Radio-Frequency (RF) signal leakage through the biasing circuit. The NLTL frequency comb generator, the broadband biasing circuit, and an output DC blocking capacitor may be integrated in a single chip in a compact packaging. Simulated RF output signal spectrum and the scattering parameters S11/S22 clearly shows that with the integrated biasing circuit, the NLTL frequency comb generator may have good input/output impedance match and be able to generate an RF output signal comprising broadband harmonics.

For the purpose of summarizing the present disclosure, certain aspects and novel features of the inventions have been described herein. One skilled in the art shall recognize that embodiments disclosed in this invention document may be implemented with various permutations, enhancements, equivalents, combinations, and improvements, all of which should fall within the scope of the present invention.

BRIEF DESCRIPTION OF THE DRAWINGS

Reference will be made to exemplary embodiments of the present invention that are illustrated in the accompanying figures. Those figures are intended to be illustrative, rather than limiting. Although the present invention is generally described in the context of those embodiments, it is not intended by so doing to limit the scope of the present invention to the particular features of the embodiments depicted and described.

Figure 1:
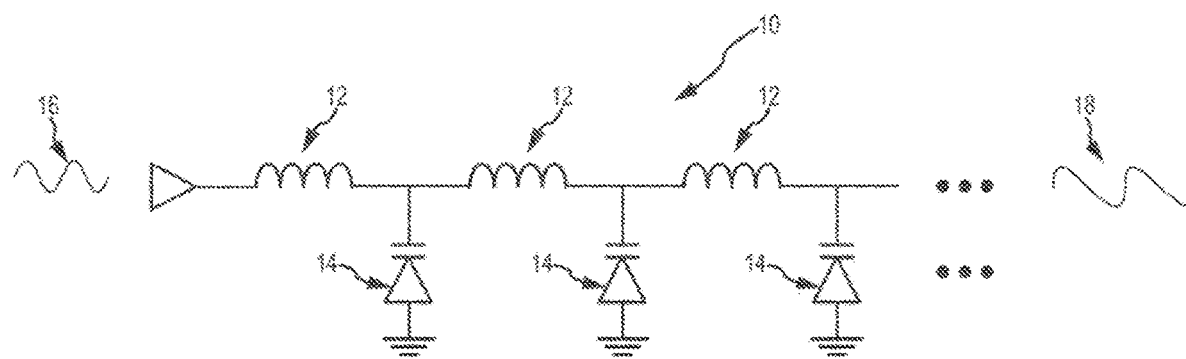
FIG. 1 depicts an equivalent circuit of a prior art NLTL.

One skilled in the art will recognize that various implementations and embodiments of the invention may be practiced in accordance with the specification. All of these implementations and embodiments are intended to be included within the scope of the invention.

DETAILED DESCRIPTION

In the following description, for purpose of explanation, specific details are set forth in order to provide an understanding of the present invention. The present invention may, however, be practiced without some or all of these details. The embodiments of the present invention described below may be incorporated into a number of different electrical components, circuits, devices, and systems. Structures and devices shown in block diagrams are illustrative of exemplary embodiments of the present invention and are not to be used as a pretext by which to obscure broad teachings of the present invention. Connections between components within the figures are not intended to be limited to direct connections. Rather, connections between components may be modified, re-formatted, or otherwise changed by intermediary components.

When the specification makes reference to "one embodiment" or to "an embodiment" it is intended to mean that a particular feature, structure, characteristic, or function described in connection with the embodiment being discussed is included in at least one contemplated embodiment of the present invention. Thus, the appearance of the phrase, "in one embodiment," in different places in the specification does not constitute a plurality of references to a single embodiment of the present invention. Each reference/document mentioned in this patent document is incorporated by reference herein in its entirety. It shall be noted that any examples provided herein are provided by way of illustration and were performed under specific conditions using a specific embodiment or embodiments; accordingly, neither these examples shall be used to limit the scope of the disclosure of the current patent document.

NLTL has been used in a wide range of device and system applications, including comb generator, time-domain reflectometry (TDR), frequency synthesizer, frequency multiplier, high-speed sampling oscilloscope, and pulse generator etc. A frequency comb generator is a signal generator that generates an output signal that has appreciable signal power at multiple harmonics of an input signal. This output signal typically comprises a series of uniformly spaced frequency components, which make the output signal spectrum appear like a comb.

The propagation phase velocity of a wave signal in a non-linear transmission line is given by:

$$V_p = \frac{1}{\sqrt{LC(V)}} \quad (1)$$

Where L is an inductance of the line and C(V) is a voltage-depending capacitance of a non-linear capacitor. The non-linear capacitor could be in forms of varactor, Schottky diode, or any types of PN junction diode, which features decreased junction capacitance under increased reverse PN junction voltage bias. When the capacitance decreases under increasing reverse voltage, the propagation velocity along the transmission line rises. As a result, the higher voltage part of the wave signal, e.g., the peak, travels faster and attempts to overtake the lower voltage part, thus forming a steep front shockwave whose steepness is ultimately limited by the line dispersion.

The reduction in transition time of a wave signal by an NLTL may be calculated as:

$$\Delta t = n(\sqrt{LC_0} - \sqrt{LC(V_{max})}) \quad (2)$$

Where $C_0$ is the zero-bias capacitance, $C(V_{max})$ is the capacitance under maximum reverse wave signal amplitude bias, and n is a number of sections of NLTL. Among different types of non-linear capacitor, varactor based NLTL is preferred due to its high $C(V_{max})/C_0$ ratio, which leads to a good amount of reduction in transition time for the wave signal.

U.S. Pat. No. 8,878,575B1 discloses an equivalent circuit of an NLTL 10 having a periodic structure of series inductors 12 and variable shunt capacitors 14, as shown in FIG. 1. Capacitance of the variable shunt capacitors 14 is voltage-dependent, e.g., the capacitance at low reverse bias is much greater than the capacitance at high reverse bias. An input signal 16 propagating on the equivalent transmission line experiences a propagation velocity that is voltage dependent. A signal that transitions from low to high voltage will be compressed in time as the initial low voltage portion of the signal travels down the line slower than the later, higher voltage portion of the signal. Consequently, the higher voltage portion of the waveform "catches up" with the lower voltage portion of the step, resulting in an increasing edge speed of the low-to-high transition, i.e., an increased slew rate. This sharper rising edge waveform produces an output signal 18 that is rich in signal harmonics in the frequency spectrum.

Embodiment 1

Figure 2:
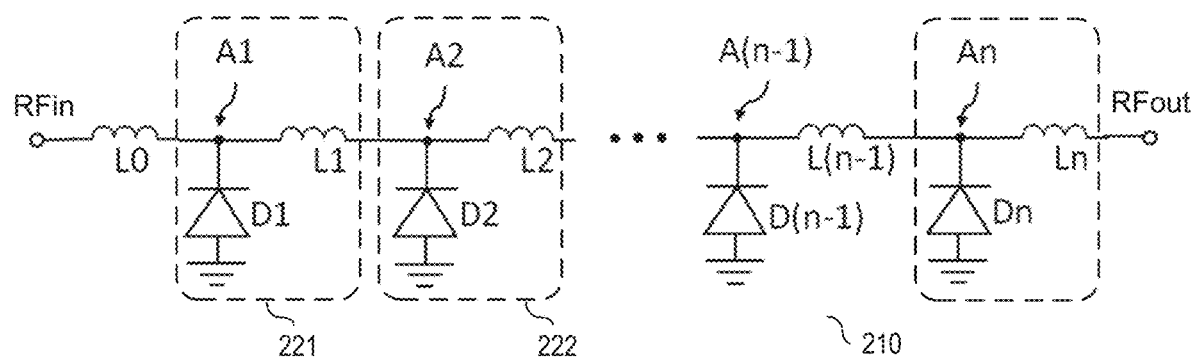
FIG. 2 depicts rise time compression along an NLTL, according to one or more embodiments of the invention.
Figure 2:
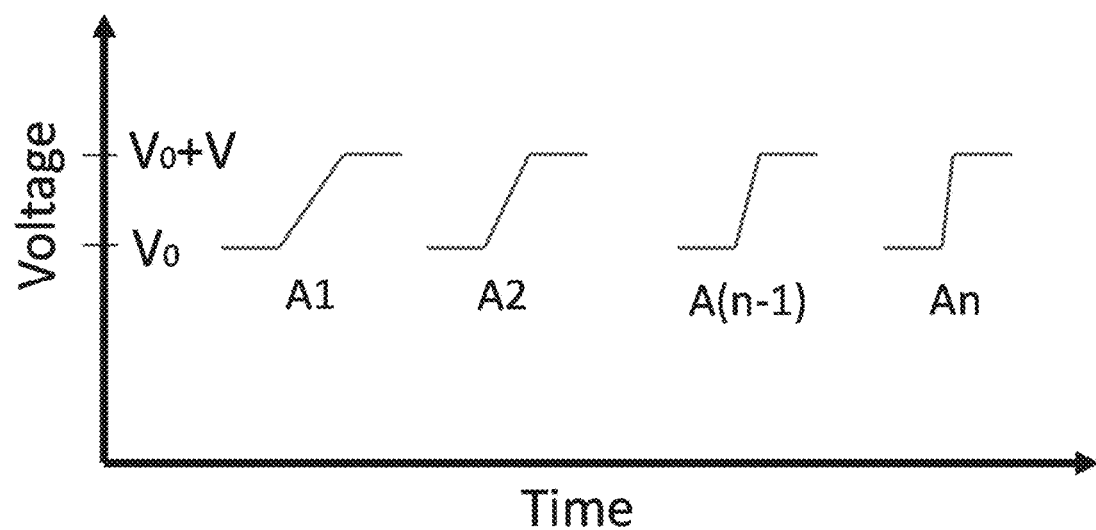

FIG. 2 depicts rise time compression along an NLTL, according to one or more embodiments of the invention. The NLTL 210 comprises a plurality of segments 221, 222, etc., cascaded in series, with each segment comprising a series inductor L and a non-linear shunt capacitor D that has a variable capacitance. As shown in FIG. 2, the first segment 221 comprises a first series inductor L1 and a first shunt capacitor D1 coupled to the first series inductor L1 at a first node A1; the second segment 222 comprises a second series inductor L2 and a second shunt capacitor D2 coupled to the second series inductor L2 at a second node A2; . . . , the N-th segment comprises an N-th series inductor Ln and an N-th shunt capacitor Dn coupled to the N-th series inductor Ln at an N-th node An.

An input signal RFin to the NLTL 210 passes through the plurality of cascaded segments and gets compressed along the direction of signal propagation. The non-linear shunt capacitors D1, D2, . . . , and Dn may be varactors (also referred as variable capacitance diodes or varactor diodes) that have voltage-dependent capacitance, which decreases under increasing reverse voltage. As shown in the embodiment in FIG. 2, the varactors have their cathodes coupled to corresponding series inductors. As a result, the rise time or rising edge of the input signal RFin is compressed along the NLTL 210, as shown in rising slope waveforms at various nodes A1, A2, . . . , An.

In one or more embodiments, the non-linear shunt capacitor at each segment may have the same base capacitance, i.e. zero-bias capacitance, and the inductor at each segment may have the same inductance. Alternatively, the series inductor and the non-linear shunt capacitor at each segment may have decreasing inductance and decreasing base capacitance, respectively, along the direction of signal propagation. When the input signal gets more compressed as it propagates along the NLTL, the input signal comprises more higher frequency harmonics. Subsequent segments may have series inductors and non-linear shunt capacitors in smaller sizes and inductance/capacitance values for impedance matching the increasingly higher frequency of the input signal with better comb frequency generation for an output signal RFout.

Embodiment 2

Figure 3:
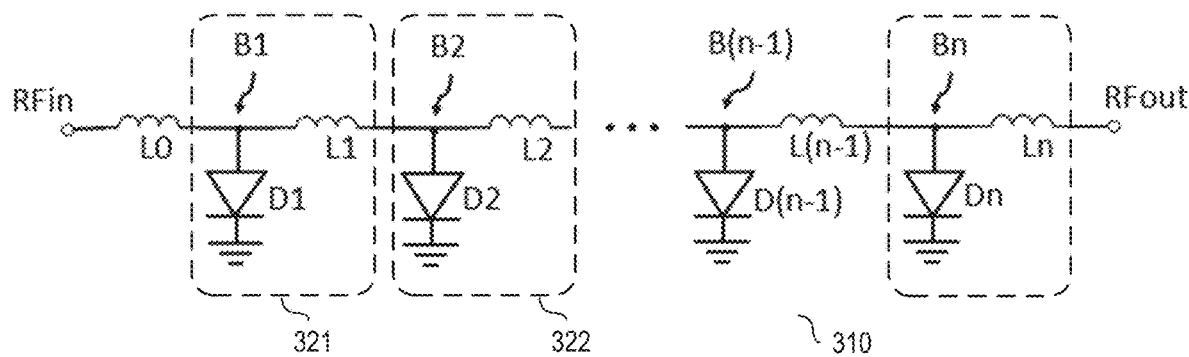
FIG. 3 depicts fall time compression along an NLTL frequency comb generator, according to one or more embodiments of the invention.
Figure 3:
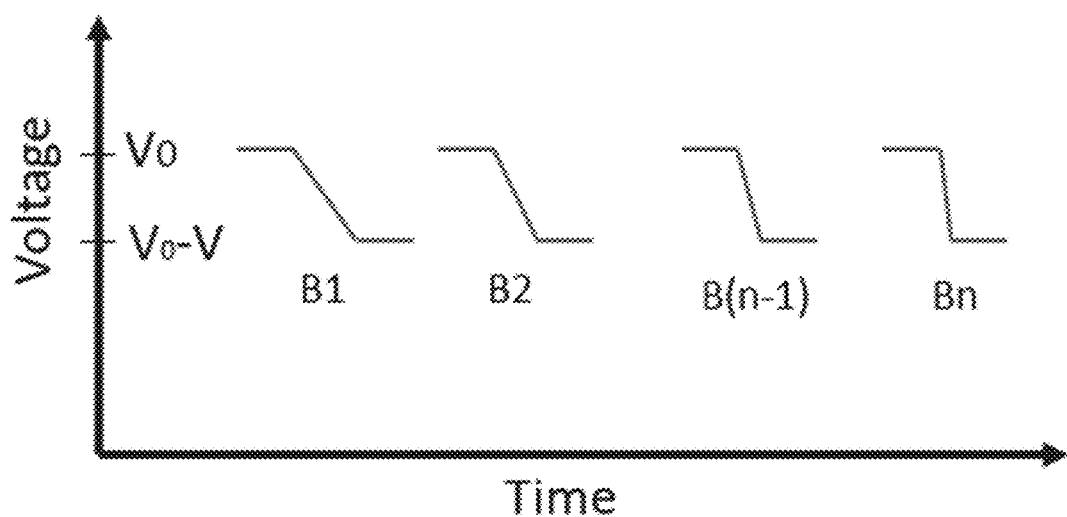

In certain situations, it is desirable to compress fall time of an input signal rather than the rise time. FIG. 3 depicts fall time compression along an NLTL frequency comb generator, according to one or more embodiments of the invention. The NLTL frequency comb generator 310 comprises a plurality of segments 321, 322, etc., cascaded in series, with each segment comprising a series inductor L and a non-linear shunt capacitor D with a variable capacitance. As shown in FIG. 3, the first segment 321 comprises a first series inductor L1 and a first shunt capacitor D1 coupled to the first series inductor L1 at a first node B1; the second segment 322 comprises a second series inductor L2 and a second shunt capacitor D2 coupled to the second series inductor L2 at a second node B2; . . . the N-th segment comprises an N-th series inductor Ln and an N-th shunt capacitor Dn coupled to the N-th series inductor Ln at an N-th node Bn.

The non-linear shunt capacitors D1, D2, . . . , and Dn may be varactors that have voltage-dependent capacitance, which decreases under increasing reverse voltage. As shown in the embodiment in FIG. 3, the varactors have their anodes coupled to corresponding series inductors. As a result, the fall time or falling edge of the input signal RFin is compressed along the NLTL frequency comb generator 310, as shown in fall slope waveforms at various nodes B1, B2, . . . , Bn. In one or more embodiments, the series inductor and the non-linear shunt capacitor at each segment may have decreasing inductance and decreasing base capacitance, respectively, along the direction of signal propagation. When the input signal gets more compressed as it propagates along the NLTL, the input signal comprises more higher-frequency harmonics. Subsequent segments may have series inductors and non-linear shunt capacitors in smaller sizes and inductance/capacitance values for impedance matching the increasingly higher frequency of the input signal with better comb frequency generation for an output signal RFout.

A typical NLTL-based comb generator, e.g., Marki Microwave's NLTL-6794SM, may require external lumped components for biasing network and output DC blocking capacitor for best performance. However, those external lumped components with limited RF bandwidth are not integrated together with the NLTL in a single standalone chip, thus having limited operation bandwidth with added cost and complexity.

Embodiment 3

Figure 4:
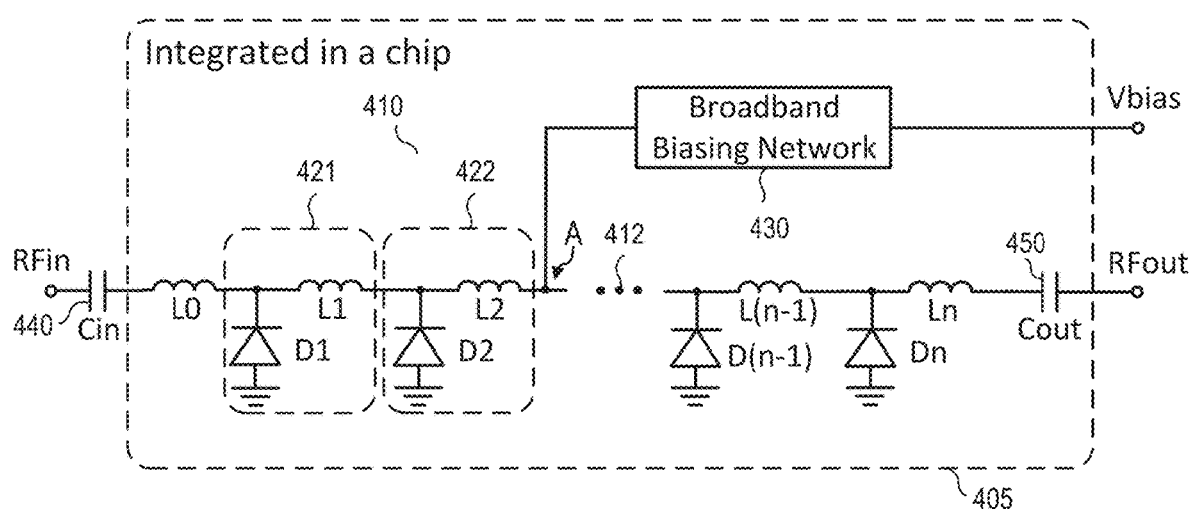
FIG. 4 depicts an NLTL frequency comb generator with an integrated broadband biasing network, according to one or more embodiments of the invention.

FIG. 4 depicts an NLTL frequency comb generator with an integrated broadband biasing network, according to one or more embodiments of the invention. The NLTL frequency comb generator 410 comprises a plurality of segments 421, 422, etc., cascaded in series, with each segment comprising a series inductor L and a non-linear shunt capacitor D coupled to the series inductor L. The non-linear shunt capacitor may be a varactor, a Schottky diode or any type of PN junction diode with a cathode coupled to the series inductor L, as shown in FIG. 4, or with an anode coupled to the series inductor L, as shown in FIG. 3. The non-linear shunt capacitor may have a voltage-dependent capacitance, which decreases under increasing reverse voltage. The series inductors in the plurality of segments form a signal propagation path 412 between an input signal RFin and an output signal RFout.

In one or more embodiments, the zero-bias capacitance of each non-linear shunt capacitor decreases along the plurality of segments in a signal propagation direction. Similarly, the inductance of each series inductor decreases along the plurality of segments in the signal propagation direction. For example, the zero-bias capacitance of the non-linear shunt capacitor D2 in the second segment 422 is less than that of the non-linear shunt capacitor D1 in the preceding segment 421.

An input DC blocking capacitor Cin 440 and an output DC blocking capacitor Cout 450 may also be incorporated for improved performance. The input DC blocking capacitor Cin 440 and the output DC blocking capacitor Cout 450 couple to an input end and an output end of the signal propagation path 412, respectively, for DC blocking. The input DC blocking capacitor Cin 440 may be an off-chip capacitor having a large value capacitance, usually more than 100 pF, to pass an input signal with frequency lower than 100 MHz. The output DC blocking capacitor Cout 450 has a smaller capacitance, e.g., less than 20 pF, and may be integrated on-chip. Additionally, the capacitance of the output DC blocking capacitor Cout 450 may be optimized to improve output impedance matching.

A broadband biasing circuit 430 may be integrated with NLTL frequency comb generator 410 into one chip 405 for compact packing and simplified application. The broadband biasing circuit 430 is coupled between an external bias voltage Vbias and the signal propagation path 412, e.g., at node A. The broadband biasing circuit provides a DC feed to the NLTL frequency comb generator, and prevents RF signal from leaking to the Vbias. However, if there are low frequency ripples and/or noises at the Vbias, such low frequency ripples and/or noises may be modulated as frequency spurs to the output signal RFout.

Embodiment 4

Figure 5:
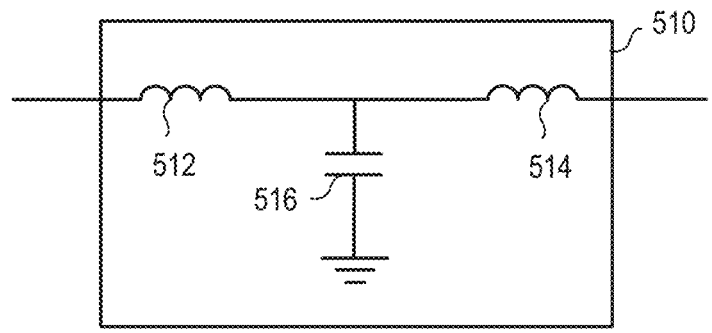
FIG. 5 depicts various circuit implementations of the broadband biasing network, according to one or more embodiments of the invention.
Figure 5:
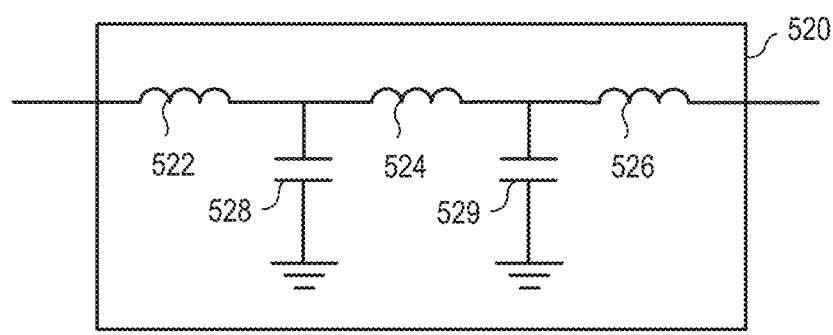

FIG. 5 depicts various broadband biasing circuits, according to one or more embodiments of the invention. The broadband biasing circuit may be a $3^{rd}$ order (T-type) low-pass filter 510 comprising a first bias inductor 512, a second bias inductor 514 coupling in series to the first bias inductor 512, and a first shunt bias capacitor 516 coupling in shunt between the first bias inductor 512 and the second bias inductor 514. Alternatively, the broadband biasing circuit may be a $5^{th}$ order (Pi-type) low-pass filter 520 comprising a third bias inductor 522, a fourth bias inductor 524, and a fifth bias inductor 526 coupled in series, a second shunt bias capacitor 528 coupling in shunt between the third bias inductor 522 and the fourth bias inductor 524, and a third shunt bias capacitor 529 coupling in shunt between the fourth bias inductor 524 and the fifth bias inductor 526. The series inductors of the broadband biasing circuit may be lossy inductors having low Q factors, with a Q value less than 20. The shunt capacitor(s) of the broadband biasing circuit may be a single capacitor or a combination of stacked capacitor, and may also be grounded with a series resistance on the shunt branch. Although FIG. 5 only shows exemplary $3^{rd}$ order and $5^{th}$ order broadband biasing circuits, one skilled in the art shall understand that other types of broadband biasing circuits with even higher orders may also be applied for broadband biasing and output matching.

Embodiment 5

Figure 6:
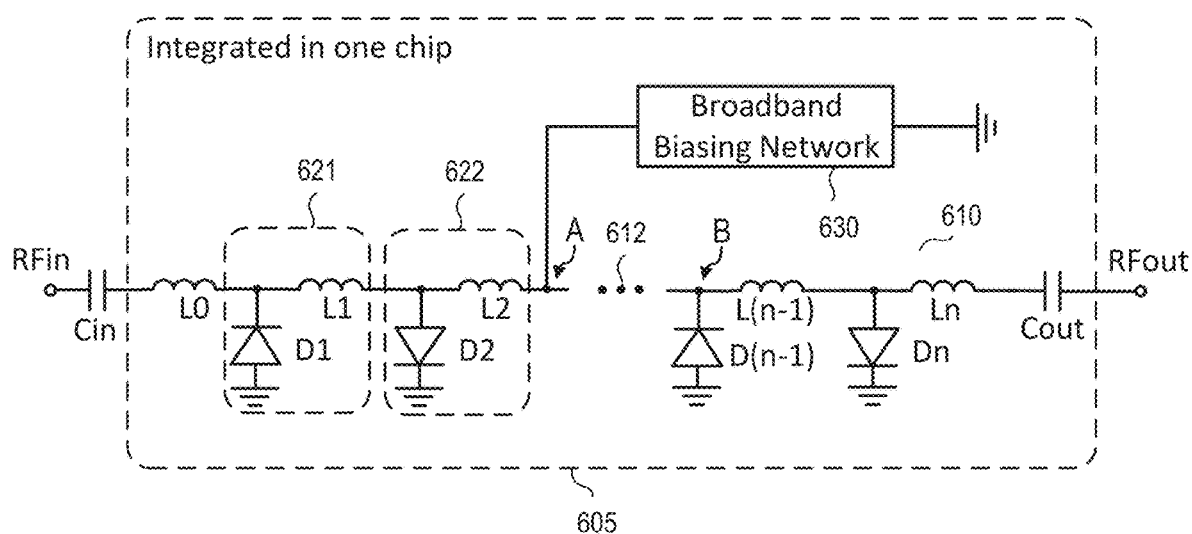
FIG. 6 depicts an alternative NLTL frequency comb generator with an integrated broadband biasing network, according to one or more embodiments of the invention.

FIG. 6 depicts an alternative NLTL frequency comb generator with an integrated broadband biasing network, according to one or more embodiments of the invention. The NLTL frequency comb generator 610 comprises a plurality of segments 621, 622, etc., cascaded in series, with each segment comprising a series inductor L and a non-linear shunt capacitor D coupled to the series inductor L. The non-linear shunt capacitor may be a varactor, a Schottky diode or any type of PN junction diode with a cathode coupled to the series inductor L. The non-linear shunt capacitor may have a voltage-dependent capacitance, which decreases under increasing reverse voltage. The series inductors in the plurality of segments form a signal propagation path 612 between an input signal RFin and an output signal RFout.

In one or more embodiments, the non-linear shunt capacitors in the NLTL frequency comb generator 610 couple to the signal propagation path 612 alternatively in polarity. As shown in FIG. 6, the non-linear shunt capacitor D1 in segment 621 has a cathode coupled to the signal propagation path 612, while the non-linear shunt capacitor D2 in segment 622 has an anode coupled to the signal propagation path 612. Such an alternative coupling configuration provides advantages of both rising time and fall time compression for input signal along the signal propagation path, without adding extra components as compared to the NLTL frequency comb generator 410. One skilled in the art shall understand that besides the alternative polarity shown in FIG. 6, other configurations, such as cathode-cathode-anode-anode . . . or cathode-cathode-cathode-anode-anode-anode . . . , may be adopted as well. Additionally, the number of non-linear shunt capacitors having cathode coupling may be the same as or different from the number of non-linear shunt capacitors having anode coupling.

A broadband biasing circuit 630 may be integrated with NLTL frequency comb generator 610 into one chip 605 for compact packing and simplified application. The broadband biasing circuit 630 is a grounded circuit coupling to the signal propagation path 612, e.g., at node A close to an input end or node B close to an output end. The broadband biasing circuit provides a DC ground to the NLTL frequency comb generator and also prevents RF signal from leaking to the DC ground. By coupling the broadband biasing circuit to the DC ground, the output signal RFout usually suffers no frequency spurs due to minimum ripples and/or noises at the DC ground.

Figure 7:
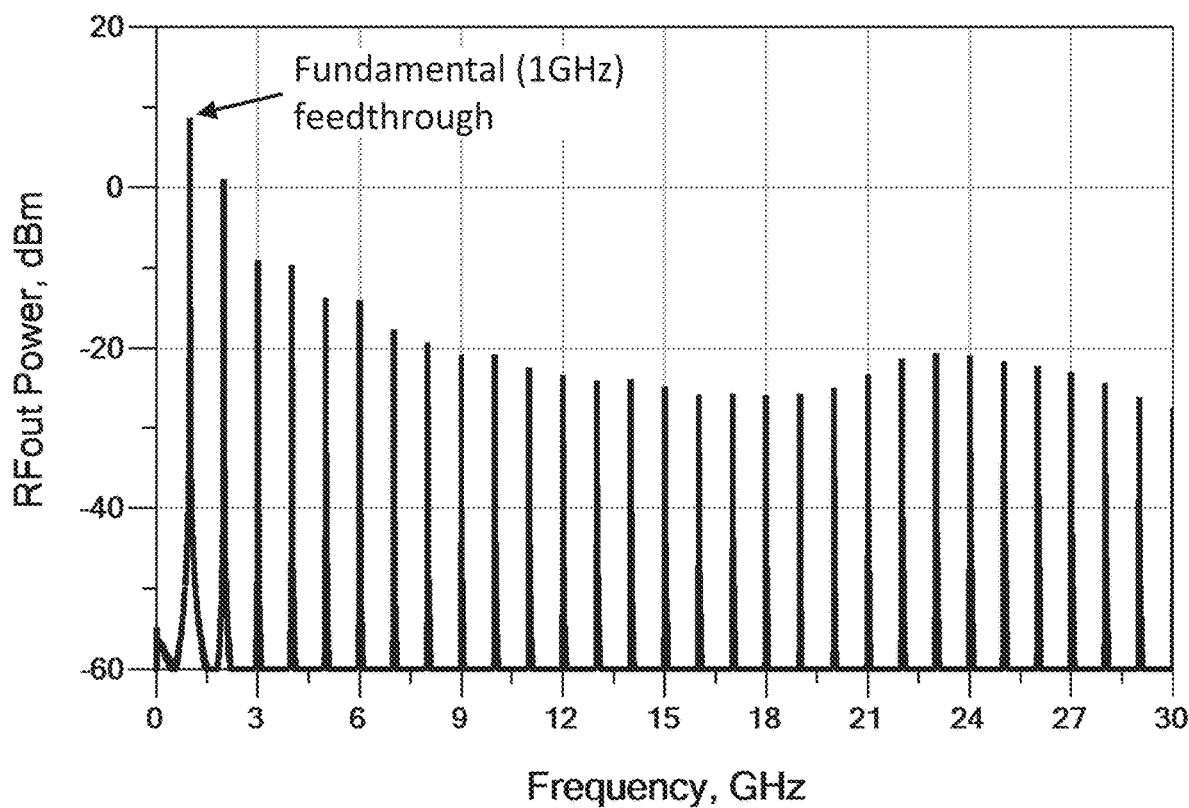
FIG. 7 depicts a spectrum of an output signal from an NLTL frequency comb generator with integrated broadband biasing network, according to one or more embodiments of the invention.

FIG. 7 depicts a spectrum of an output signal from an NLTL frequency comb generator with integrated broadband biasing network, according to one or more embodiments of the invention. The spectrum of the output signal is obtained under an input signal RFin at a input frequency of 1 GHz and power at 20 dBm. As shown in FIG. 7, with integrated broadband biasing network, the output signal has a plurality of harmonics with considerable power levels covering a broad band. For example, the $25^{th}$ harmonic (25 GHz) still has a power level of around −20 dBm. Such high-power broadband harmonics are very desirable for many RF applications.

Figure 8:
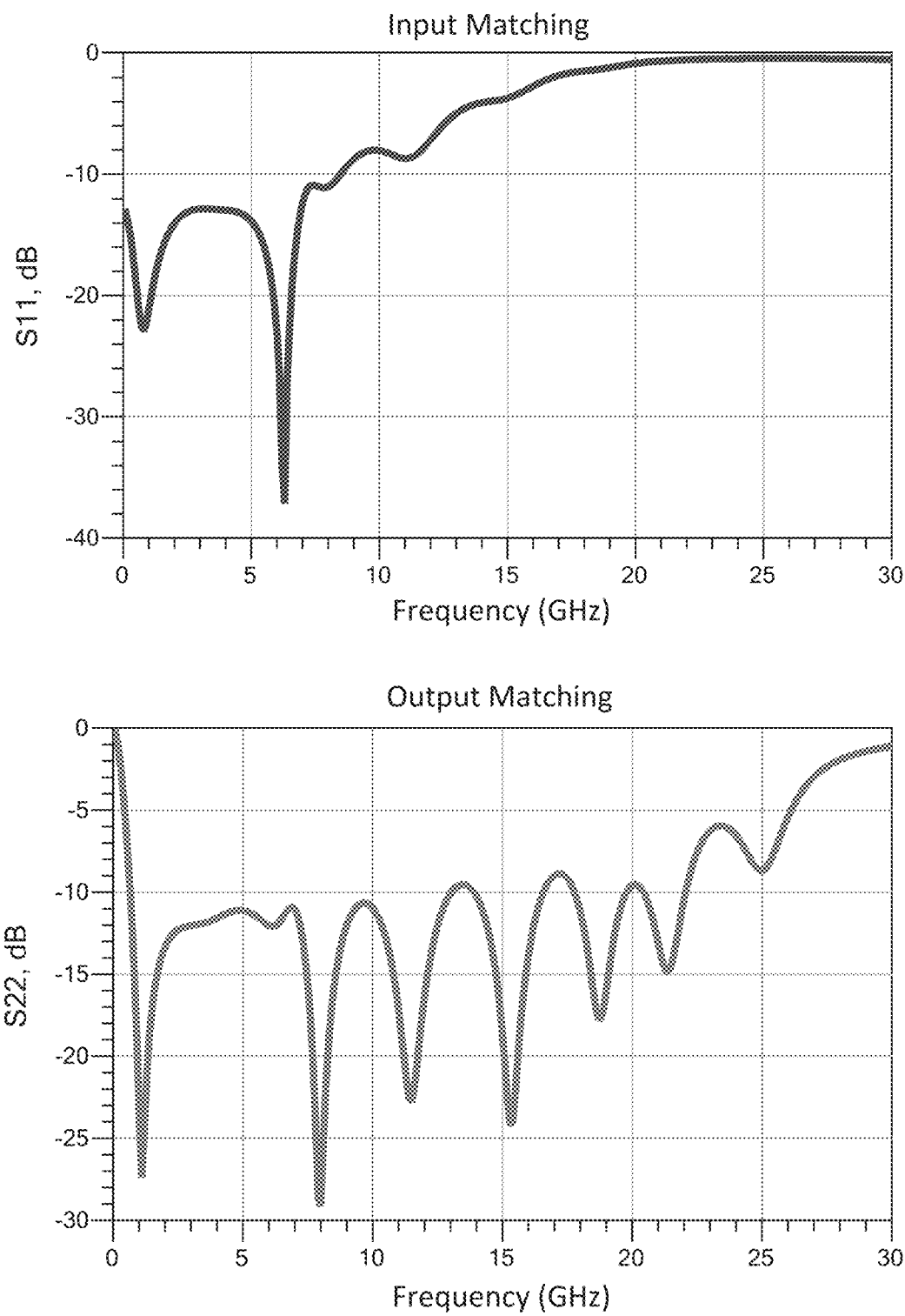
FIG. 8 depicts an input reflection coefficient S11 and an output reflection coefficient S22 of an NLTL frequency comb generator with integrated broadband biasing network, according to one or more embodiments of the invention.

For an RF circuit or network, its characteristics of linear networks such as gain, loss, impedance, phase group delay, and voltage standing wave ratio (VSWR) may be represented by S-parameters, also referred to as S-matrix or scattering parameters. In the S-matrix, S11 is the input reflection coefficient with the output of the network terminated by a matched load, and S22 is the output reflection coefficient. An S11 value less than −10 dB would be viewed as a good input impedance match, and an S22 value less than −10 dB would be considered as a good output impedance match. FIG. 8 depicts an input reflection coefficient S11 and an output reflection coefficient S22 of an NLTL frequency comb generator with integrated broadband biasing network, according to one or more embodiments of the invention. As shown in FIG. 8, the S11 and S22 are better than −10 dB over a wide band, indicating a good input and output impedance match.

The foregoing description of the invention has been described for purposes of clarity and understanding. It is not intended to limit the invention to the precise form disclosed. Various modifications may be possible within the scope and equivalence of the appended claims.

It will be appreciated to those skilled in the art that the preceding examples and embodiments are exemplary and not limiting to the scope of the present invention. It is intended that all permutations, enhancements, equivalents, combinations, and improvements thereto that are apparent to those skilled in the art upon a reading of the specification and a study of the drawings are included within the true spirit and scope of the present invention.

It shall also be noted that elements of the claims below may be arranged differently, including having multiple dependencies, configurations, and combinations. For example, in embodiments, the subject matter of various claims may be combined with other claims.

The invention claimed is:

1. A frequency comb generator comprising:
a non-linear transmission line (NLTL) frequency comb generator receiving an input signal at an input frequency and generating an output signal comprising multiple harmonics of the input signal, the NLTL frequency comb generator comprising:
a plurality of segments cascaded in series to form a signal propagation path, each segment comprises a series inductor and a nonlinear shunt capacitor coupled to the series inductor, the nonlinear shunt capacitor has a voltage-dependent capacitance that decreases under increasing reverse voltage bias; and
a biasing circuit coupled to the signal propagation path, the biasing circuit provides a DC bias to the NLTL frequency comb generator and prevents the output signal from leaking to the DC bias.

2. The frequency comb generator of claim 1, wherein the nonlinear shunt capacitors of the plurality of segments are varactors, Schottky diodes, or any type of PN junction diodes, coupled to corresponding series inductors in the same polarity.

3. The frequency comb generator of claim 1, wherein the nonlinear shunt capacitors of the plurality of segments are varactors, Schottky diodes, or any type of PN junction diodes, coupled to corresponding series inductors in alternative polarities along the signal propagation path.

4. The frequency comb generator of claim 1, wherein the nonlinear shunt capacitor in a segment has a zero-bias capacitance more than that of the nonlinear shunt capacitor in a subsequent segment along the signal propagation path.

5. The frequency comb generator of claim 1, wherein the biasing circuit couples to an external bias voltage or a DC ground.

6. The frequency comb generator of claim 1, wherein the biasing circuit is a low-pass filter.

7. The frequency comb generator of claim 6, wherein the low-pass filter is a $3^{rd}$-order low-pass filter or a $5^{th}$-order low-pass filter;
wherein the $3^{rd}$-order low-pass filter comprising a first bias inductor, a second bias inductor coupling in series to the first bias inductor, and a first shunt bias capacitor coupling in shunt between the first bias inductor and the second bias inductor;

wherein the $5^{th}$-order low-pass filter comprising:
a third bias inductor, a fourth bias inductor, and a fifth bias inductor coupled in series;
a second shunt bias capacitor coupling in shunt between the third bias inductor and the fourth bias inductor; and
a third shunt bias capacitor coupling in shunt between the fourth bias inductor and the fifth bias inductor.

8. The frequency comb generator of claim 1 further comprising:
an input capacitor coupled to an input end of the signal propagation path for DC blocking; and
an output capacitor coupled to an output end of the signal propagation path for DC blocking and for output impedance matching.

9. The frequency comb generator of claim 8, wherein the NLTL frequency comb generator, the biasing circuit, and the output capacitor are integrated into a single chip.

10. The frequency comb generator of claim 8, wherein the output capacitor has a capacitance less than the input capacitor.

11. A frequency comb generator comprising:
a non-linear transmission line (NLTL) frequency comb generator receiving an input signal at an input frequency and generating an output radio frequency (RF) signal comprising multiple harmonics of the input signal, the NLTL frequency comb generator comprising:
a plurality of segments cascaded in series to form a signal propagation path, each segment comprises a series inductor and a nonlinear shunt capacitor coupled to the series inductor, the nonlinear shunt capacitors of the plurality of segments couple to corresponding series inductors in the same polarity along the signal propagation path; and
a biasing circuit coupled to the signal propagation path, the biasing circuit provides a DC bias to the NLTL frequency comb generator and prevents the output RF signal from leaking to the DC bias.

12. The frequency comb generator of claim 11, wherein the nonlinear shunt capacitor of each segment is a varactor, a Schottky diode, or any type of PN junction diode with a voltage-dependent capacitance that decreases under increasing reverse voltage bias.

13. The frequency comb generator of claim 12, wherein the nonlinear shunt capacitor in a segment has a zero-bias capacitance more than that of the nonlinear shunt capacitor in a subsequent segment along the signal propagation path.

14. The frequency comb generator of claim 11, wherein the biasing circuit is a circuit coupled to an external bias voltage or a DC ground.

15. The frequency comb generator of claim 11, wherein the biasing circuit is a low-pass filter.

16. The frequency comb generator of claim 15, wherein the low-pass filter is a $3^{rd}$-order low-pass filter or a $5^{th}$-order low-pass filter;
wherein the $3^{rd}$-order low-pass filter comprises a first bias inductor, a second bias inductor coupling in series to the first bias inductor, and a first shunt bias capacitor coupling in shunt between the first bias inductor and the second bias inductor;
wherein the $5^{th}$-order low-pass filter comprises:
a third bias inductor, a fourth bias inductor, and a fifth bias inductor coupled in series;
a second shunt bias capacitor coupling in shunt between the third bias inductor and the fourth bias inductor; and
a third shunt bias capacitor coupling in shunt between the fourth bias inductor and the fifth bias inductor.

17. The frequency comb generator of claim 11 further comprising:
an input capacitor coupled to an input end of the signal propagation path for DC blocking; and
an output capacitor coupled to an output end of the signal propagation path for DC blocking and for output impedance matching.

18. The frequency comb generator of claim 17, wherein the NLTL frequency comb generator, the biasing circuit, and the output capacitor are integrated into a single chip.

19. The frequency comb generator of claim 17, wherein the output capacitor has a capacitance less than the input capacitor.

* * * * *